United States Patent
Miyamae et al.

(10) Patent No.: US 7,127,142 B2
(45) Date of Patent: Oct. 24, 2006

(54) OPTICAL COMMUNICATION DEVICE

(75) Inventors: Akira Miyamae, Fujimi-machi (JP);
Takeo Kaneko, Misato-mura (JP);
Kazuhiko Suzuki, Usuda-machi (JP)

(73) Assignee: Seiko Epson Corporation, Tokyo (JP)

( * ) Notice: Subject to any disclaimer, the term of this patent is extended or adjusted under 35 U.S.C. 154(b) by 103 days.

(21) Appl. No.: 10/730,105

(22) Filed: Dec. 9, 2003

(65) Prior Publication Data

US 2004/0136725 A1   Jul. 15, 2004

(30) Foreign Application Priority Data

Dec. 12, 2002   (JP)   ............................. 2002-361391

(51) Int. Cl.
*G02B 6/30*   (2006.01)
(52) U.S. Cl. ............................. 385/49; 385/88; 385/93
(58) Field of Classification Search ............ 385/88–94, 385/49
See application file for complete search history.

(56) References Cited

U.S. PATENT DOCUMENTS

| | | | |
|---|---|---|---|
| 5,768,456 A | 6/1998 | Knapp et al. | |
| 6,243,508 B1 | 6/2001 | Jewell et al. | |
| 6,445,475 B1 | 9/2002 | Okubora et al. | |
| 6,491,446 B1 * | 12/2002 | Kryzak | 385/89 |
| 6,705,769 B1 * | 3/2004 | Brezina et al. | 385/88 |
| 6,792,171 B1 * | 9/2004 | Hargis et al. | 385/14 |
| 6,932,518 B1 * | 8/2005 | Greenlaw | 385/88 |

FOREIGN PATENT DOCUMENTS

| | | |
|---|---|---|
| CN | 1248798 A | 3/2000 |
| JP | 7-202357 | 8/1995 |
| JP | A 11-168233 | 6/1999 |
| JP | A-11-345987 | 12/1999 |
| JP | A 2001-042170 | 2/2001 |
| JP | A-2001-144366 | 5/2001 |
| JP | A 2001-242358 | 9/2001 |
| WO | WO 02/093696 A2 | 11/2002 |

OTHER PUBLICATIONS

Niels Vagn Pedersen et al., "High-Frequency Hybrid Integration Using New Flexguide Technique", European Microelectronics Conference, pp. 457-465, (May 14, 1995).
European Search Report.

* cited by examiner

*Primary Examiner*—Sarah Song
(74) *Attorney, Agent, or Firm*—Oliff & Berridge, PLC.

(57) ABSTRACT

To provide an optical communication device suitable for the transmission of a high-frequency signal. An optical communication device includes a first substrate having a light-emitting element or a light-receiving element on one side of the first substrate; a second substrate having an electronic circuit to perform operation control of the light-emitting element or the light-receiving element; and a flexible substrate which connects the section between the light-emitting element or the light-receiving element and the electronic circuit while achieving impedance matching.

14 Claims, 5 Drawing Sheets

OPTICAL COMMUNICATION DEVICE

BACKGROUND OF THE INVENTION

1. Field of Invention

The present invention relates to enhanced technology of an optical communication device (optical transceiver) to perform optical communication by using light.

2. Description of Related Art

Optical communication to perform information communication by using light as a carrier is one communication method which realizes high-speed and high-capacity communication. The construction of backbone networks and subscriber-system networks utilizing these features has become active in Japan and abroad. A terminal device on the subscriber side for the purpose of performing optical communication (for example, a personal computer) is provided with an optical communication device as an interface to transmit and receive optical signals.

A related art optical communication device may include components, such as a transmission section to convert an electrical signal carrying transmission information into an optical signal and transmitting the signal; a receiving section to convert an optical signal carrying received information into an electrical signal; and a connection section (optical connector) to optically connect an optical fiber with the transmission section or the receiving section.

In many optical communication devices, commonly called can packages a light-emitting element or a light-receiving element contained inside a metal housing is used. Such an optical communication device is disclosed in a document, for example, Japanese Unexamined Patent Application Publication No. 11-168233.

In recent years, the bandwidth of signals used for optical communication has begun to reach above several GHz to 10 GHz or higher, even in comparatively small networks such as LANs (Local Area Networks), and also in the optical communication devices, there has been an increasing demand for higher speed corresponding to such high-frequency transmission.

However, in an optical communication device using a can package, since the section between the can package and an electronic circuit to drive electro optical elements (light-emitting elements and light-receiving elements) contained in the can package is connected via metal terminals (metal pins) provided in the can package, transmission loss occurs in these metal terminals, and achieving higher speed has been difficult. The reason for this is that, since it is difficult to adjust the transmission characteristics, such as the characteristic impedance of metal terminals, reflection of the signal due to the impedance mismatch occurs in this portion, causing signal transmission to be obstructed. Such a problem becomes more conspicuous the higher the frequency of the signal to be transmitted becomes, and signal transmission becomes extremely difficult in the case of a high-frequency signal of several GHz or higher.

Accordingly, an advantage of the present invention is to provide an optical communication device suitable to transmit a high-frequency signal.

SUMMARY OF THE INVENTION

To achieve the above-mentioned advantage, the optical communication device of an aspect of the present invention includes: a first substrate having a light-emitting element or a light-receiving element on one side of the first substrate; a second substrate having an electronic circuit to perform operation control of the light-emitting element or the light-receiving element; and a flexible substrate which connects the section between the light-emitting element or the light-receiving element and the electronic circuit while achieving impedance matching.

For the flexible substrate, it is easy to adjust the characteristic impedance so as to be suitable for the transmission of a high-frequency signal by appropriately selecting the shape (the width, the thickness, etc.) of a transmission line and the type of insulator serving as a substrate (base). Therefore, the connection of the section between electro optical elements (light-emitting elements and/or light-receiving elements) and the electronic circuit by using a flexible substrate in which the characteristic impedance is adjusted to a desired value makes it possible to avoid signal deterioration by achieving impedance matching of an electrical signal with respect to the entire transmission line in the optical communication device, thereby realizing an optical communication device suitable for the transmission of a high-frequency signal. Furthermore, a can package which has been used in the related art generally requires many mounting steps, and moreover it is comparatively expensive. However, since the present invention is configured so as not to use a can package, there is the advantage of the optical communication device being reduced in cost.

The "optical communication device" in this specification includes not only devices incorporating the configuration related to transmission of signal light (light-emitting elements, etc.) and the configuration related to reception of signal light (light-receiving elements, etc.), but also devices incorporating only the configuration related to transmission (commonly called optical transmission modules) and only the configuration related to reception of signal light (commonly called optical receiving modules).

The first and second substrates are preferably arranged in such a manner as to be nearly at right angles to each other. In this manner, since the substrate side of the first substrate having light-emitting elements, etc. and the substrate side of the second substrate are arranged so as to form an angle of approximately 90 degrees, the optical communication device can be reduced in size and made thin. Furthermore, since the degree of freedom of the arrangement of the first and second substrates is high due to the flexibility of the flexible substrate, in addition to the above-mentioned nearly perpendicular arrangement, various other arrangements can be adopted.

Preferably, one end portion of the flexible substrate is bonded in such a manner as to cover nearly the entire surface of on the side of the first substrate. As a result, a large contact area between the flexible substrate and the first substrate can be ensured, and the bonding strength thereof can be increased.

Preferably, the flexible substrate includes a microstrip line having a flexible insulating substrate (insulating base), a signal line arranged on one side of the insulating substrate, and a grounding film arranged on the other side of the insulating substrate. The microstrip line serves the impedance matching function. The adoption of a microstrip line makes the adjustment of the characteristic impedance easier, is effective to reduce crosstalk, and allows a high-quality transmission line to be constructed. Furthermore, it becomes possible to reduce or prevent electromagnetic radiation from the signal line from leaking outside the optical communication device by causing the grounding film (grounding pattern) on the other side to have an electromagnetic shielding effect. It also becomes possible to. avoid an adverse influence on the signal line by external electromagnetic noise. In particular, in an aspect of the present invention, since the major portion of the first substrate is covered by such a flexible substrate, the electromagnetic shielding characteristics can be increased even further. Furthermore, in the related art where a can package is used, in order to avoid the occurrence of crosstalk between transmission and reception as a result of electromagnetic radiation and reception occurring at metal terminal portions, each of the transmission side and the receiving side needs to be covered by a member having an electromagnetic shielding effect, and the reduction of the size of the device is difficult. However, by adopting a microstrip line, such an inconvenience can be avoided.

Also, preferably, the flexible substrate includes a first microstrip line including a flexible insulating substrate, a first signal line arranged on one side of the insulating substrate, and a first grounding film arranged on the other side of the insulating substrate; a second microstrip line including the insulating substrate, a second signal line arranged on the other side of the insulating substrate, and a second grounding film arranged on the one side of the insulating substrate. As a result, since the signal line of the transmission side and the signal line of the receiving side can be arranged separately on the obverse side and the reverse side, respectively, crosstalk characteristics between the transmission and reception can be enhanced.

More preferably, the first grounding film and the second grounding film are arranged in such a manner as to partially overlap each other, with the insulating substrate therebetween. As a result, since the grounding potential can be arranged between individual signal lines, the crosstalk characteristics between the transmission and reception can be enhanced even further. Even in the case where such a configuration is adopted, since the flexible substrate can be manufactured at a comparatively low cost, there is the advantage that an optical communication device having superior crosstalk characteristics can be realized inexpensively.

Preferably, the first substrate is formed of a light-transmitting member, and a light-emitting surface or a light-receiving surface of the light-emitting element or the light-receiving element is arranged so as to face the first substrate. As a result, since the first substrate can be made to serve the function of protecting the light-emitting surface or the light-receiving surface, the configuration of the optical communication device can be simplified.

The light-emitting element or the light-receiving element is preferably arranged inside an opening of the flexible substrate, which is made to overlap the first substrate. As a result, since the circumference of the light-emitting element or the light-receiving element can be surrounded by a grounding film, it becomes possible to suppress the influence of external noise even more.

Also, preferably, the light-emitting element or the light-receiving element is preferably arranged on the flexible substrate, which is made to overlap the first substrate. In this case, the light-emitting surface or the light-receiving surface of the light-emitting element or the light-receiving element is arranged so as to face the first substrate via an opening provided on the flexible substrate. Since the light-emitting element or the light-receiving element is arranged (mounted) directly on the flexible substrate, there is no need to form a wiring pattern on the first substrate, and thus the manufacturing process can be simplified to achieve a lower cost. In particular, in a case where the first substrate is formed of glass, since the wiring pattern need not be formed on a glass surface, which is comparatively difficult, the manufacturing process can be made easier, which is convenient. Furthermore, since the flexible substrate is directly connected to the light-emitting elements, etc., the number of connection portions can be decreased, making it possible to transmit a wider bandwidth signal.

Preferably, the optical communication device further includes a lens to collect outgoing light from the light-emitting element or incident light to the light-receiving element. As a result, the optical coupling efficiency can be enhanced.

The lens is preferably formed integrally with the first substrate. Such a lens can be formed using a molding method, such as a 2P (Photo-Polymer) method. As a result of using a 2P method, etc., a plurality of lenses are formed collectively with high positional accuracy on a large substrate, which is a base body for the first substrate, and thereafter, the base body is cut out, thereby making it possible to form a large number of first substrates at a time. Thus, it becomes possible to realize a low-cost, highly accurate, compact optical communication device.

Also, preferably, the first substrate is formed of a non-light-transmitting member, and the light-emitting element or the light-receiving element is arranged back-to-back with one side of the first substrate so that the light-emitting surface or the light-receiving surface is directed toward free space. In this case, since a non-transparent substrate, such as an inexpensive glass epoxy substrate having a superior mechanical strength, which is more suitable to form a wiring pattern and to mount elements, can be used, it is possible to realize an inexpensive optical communication device having superior electrical characteristics and superior mechanical characteristics. Also, in this case, the provision of a lens to collect outgoing light from the light-emitting element or incident light to the light-receiving element is more preferable.

DETAILED DESCRIPTION OF EXEMPLARY EMBODIMENTS

Exemplary embodiments of the present invention will now be described below with reference to the figures.

Figure 1A:
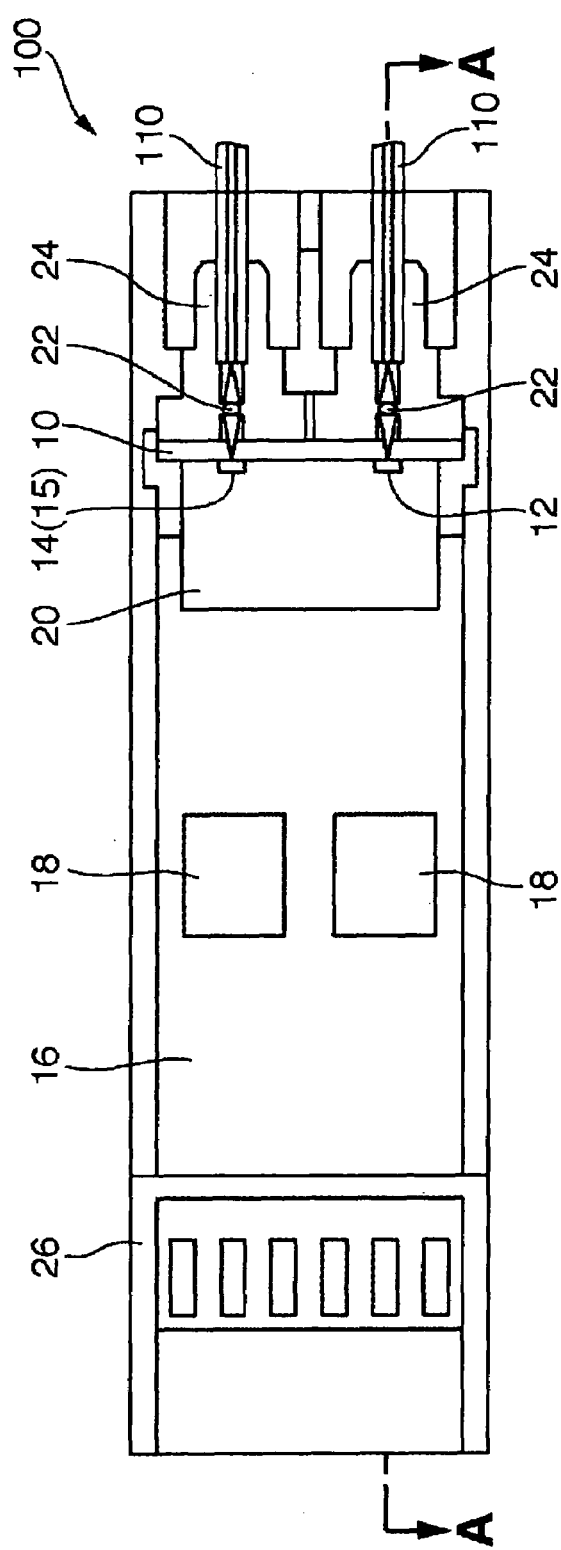
FIGS. 1(A) and 1(B) illustrate a configuration of an optical communication device of an exemplary embodiment.
Figure 1B:
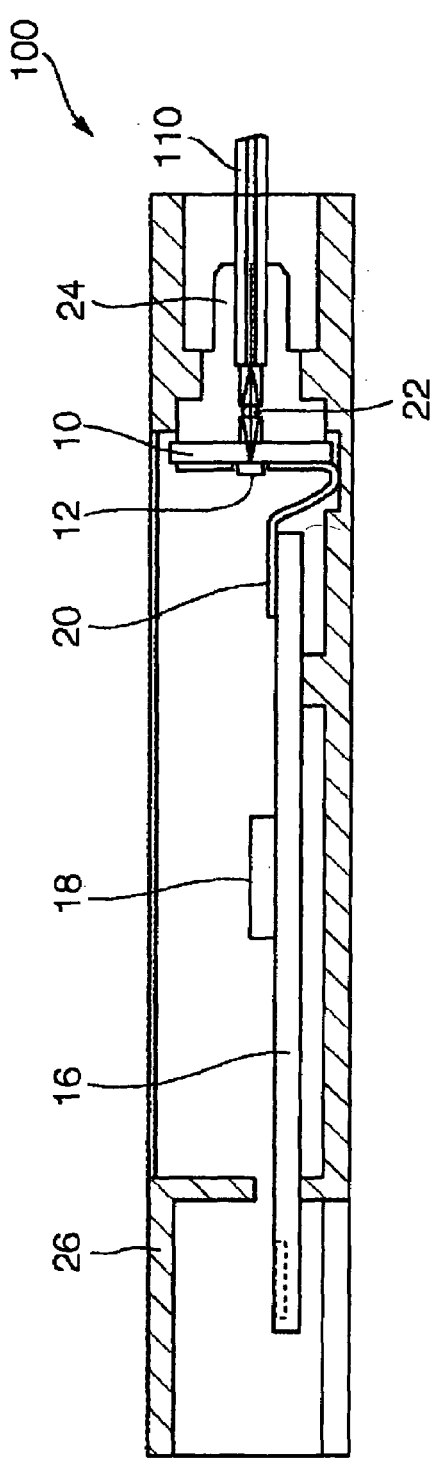

FIG. 1 illustrates a configuration of an optical communication device of an exemplary embodiment to which the present invention is applied. FIG. 1A shows a plan view when an optical communication device 100 is viewed from above, and FIG. 1B shows a sectional view taken along the line A—A shown in FIG. 1A. The optical communication device 100 of this embodiment, shown in FIGS. 1(A) and 1(B), performs information communication via an optical fiber 110 through which signal light is propagated, and the optical communication device 100 includes a first substrate 10, a VCSEL (Vertical Cavity Surface Emitting Laser) 12, a photodetector 14, a preamplifier 15, a second substrate 16, electronic parts 18, a flexible substrate 20, a lenses 22, a sleeves 24, and a housing 26.

The first substrate 10 is a flat-plate member made from a material, such as glass or a resin, having a light transmittance characteristic to signal light, with the VCSEL 12 and the photodetector 14 being mounted on one side thereof. As shown in FIGS. 1(A) and 1B, the first substrate 10 is arranged so as to nearly intersect at right angles to the second substrate 16.

The VCSEL 12 is a light-emitting element which emits signal light used for information transmission, and is mounted at a predetermined position on one side of the first substrate 10. Although in this embodiment, a VCSEL, which is a light-emitting element of a surface light-emitting type, is used as a light-emitting element, another light-emitting element (for example, a light-emitting element of an edge-emitting type) may be used.

The photodetector 14 is a light-receiving element which receives signal light which is sent externally via the optical fiber 110 and which outputs an electrical signal corresponding to the intensity thereof, and is provided at a predetermined position on one side of the first substrate 10. The preamplifier 15 is mounted in proximity with the photodetector 14, and converts the output current of the photodetector 14 into a voltage signal. The details of the position at which the preamplifier 15 is arranged will be described later. In this exemplary embodiment, the input/output impedance of each element, such as the VCSEL 12, is 50Ω (ohms).

The second substrate 16 includes an electronic circuit formed of the electronic parts 18 to control the operation of the optical communication device 100, other circuit elements (not shown), and a wiring pattern. The second substrate 16 is electrically connected to the VCSEL 12 formed on the first substrate 10 via the flexible substrate 20 bonded at one end thereof. For the wiring pattern on the second substrate 16, impedance matching is achieved so as to be suitable for the transmission of a high-frequency signal. At the other end of the second substrate 16, a connector to connect to make electrical connection with external devices (not shown) is formed.

The electronic parts 18 are used to control the operation of the optical communication device 100, and are mounted on the second substrate 16. These electronic parts 18 include a driver to drive the VCSEL 12, and a limiting amplifier to convert an output signal from the photodetector 14 into a digital signal. The input/output impedance of the electronic parts 18 is 50Ω.

The flexible substrate 20 is a flexible film-like wiring substrate (commonly called FPC), and connects the section between the VCSEL 12 on one side of the first substrate 10 and the electronic circuit on the second substrate 16 while achieving impedance matching. This flexible substrate 20 is formed so as to include a transmission line in which the characteristic impedance is adjusted so as to be suitable for the transmission of a high-frequency signal. In this exemplary embodiment, the characteristic impedance of the transmission line is set at 50Ω. When a transmission electrical signal is input from the connector provided at the end portion of the second substrate 16, the electrical signal is converted into a driving signal for the VCSEL 12 by a driver contained in the electronic part 18, and the driving signal is transmitted to the VCSEL 12 via the wiring pattern on the second substrate 16, the flexible substrate 20, and the wiring pattern on the first substrate 10. Furthermore, the signal light sent via the optical fiber 110 is converted into a very weak electrical current (output signal) by the photodetector 14, and the electrical current is converted into a voltage at the preamplifier 15. Thereafter, the voltage is sent to the electronic part 18 via the wiring pattern on the first substrate 10, the flexible substrate 20, and the wiring pattern on the second substrate 16, after which the voltage is converted into a digital signal at the limiting amplifier inside the electronic part 18. Thereafter, the digital signal is output to an external device from the connector at the end portion of the second substrate 16. The flexible substrate 20 will be described later in greater detail.

One of the lenses 22 collects signal light which is emitted from the VCSEL 12 and which is transmitted through the first substrate 10, and guides the signal light to the end surface of the optical fiber 110. Also, other of the lenses 22 collects signal light which is sent via the optical fiber 110 and guides the signal light to the light-receiving surface of the photodetector 14. The sleeve 24 is a connection section to which one end of the optical fiber 110 is connected, and has the lens 22 incorporated therein. The housing 26 supports individual elements which form the optical communication device 100 of this exemplary embodiment.

Next, the details of the flexible substrate 20 will be described below.

Figure 2A:
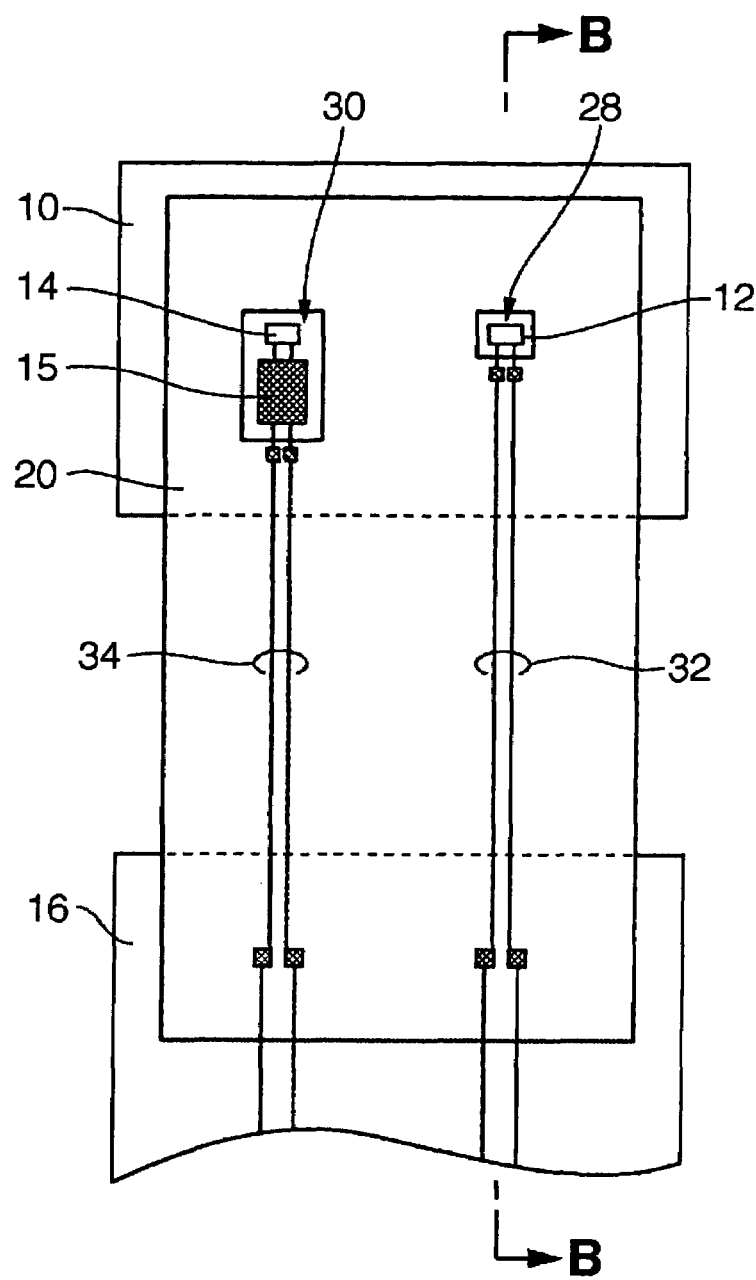
FIGS. 2(A) and 2(B) illustrate in detail the structure of a flexible substrate.
Figure 2B:
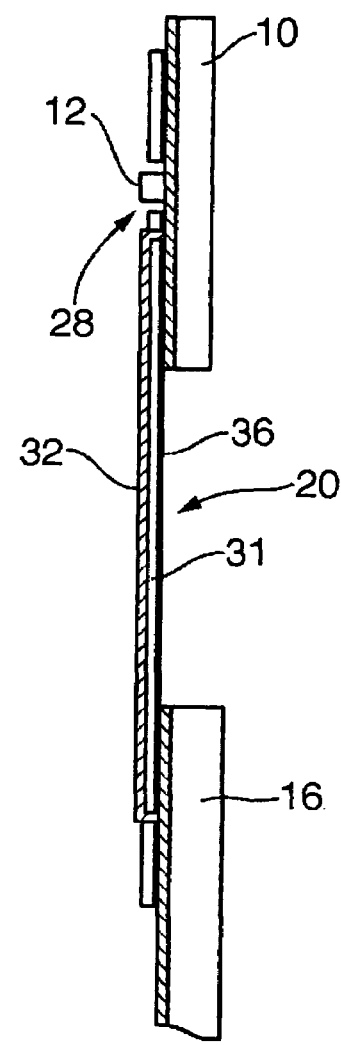

FIGS. 2(A) and 2(B) illustrate in detail the structure of the flexible substrate 20. FIG. 2(A) shows a plan view of the flexible substrate 20, and FIG. 2(B) shows a sectional view taken along the plane B-B shown in FIG. 2(A). As shown in FIGS. 2(A) and 2(B), the flexible substrate 20 is bonded in such a manner that the one end portion covers nearly the entire surface of the first substrate 10 and the other end portion is bonded to the second substrate 16. The flexible substrate 20 has, within the bonded surface on the first substrate 10 side, an opening 28 at which the VCSEL 12 is exposed, and an opening 30 at which the photodetector 14 and the preamplifier 15 are exposed. In this manner, as a result of bonding the flexible substrate 20 in such a manner as to nearly cover the entire surface of the first substrate 10, a large contact area can be ensured, and the bonding strength thereof can be increased.

The flexible substrate 20 has a signal line 32 to transmit a driving signal to the VCSEL 12 and a signal line 34 to transmit an output signal from the photodetector 14 on one side (the obverse surface) of an insulating substrate (insulating base) 31, and has a grounding film (grounding pattern) 36 which should be connected to the grounding potential on nearly the entire surface on the other side (the reverse surface) of the insulating substrate 31. That is, the flexible substrate 20 of this exemplary embodiment includes a commonly called microstrip line, and this microstrip line realizes the impedance matching function.

More specifically, the characteristic impedance Z0 at the microstrip line can be determined by the calculation equation described below if the line width of the signal lines 32 and 34 is denoted as B, the thickness thereof is denoted as C, the spacing between the signal lines 32 and 34 and the grounding film 36 is denoted as H, and the relative dielectric constant of the insulating substrate 31 which forms the flexible substrate 20 is denoted as ∈r:

$$Z0=(87/(\in r+1.41)^{1/2})\times \ln(5.98H/(0.8B+C))$$

The flexible substrate 20 of this exemplary embodiment is formed in such a manner that the characteristic impedance becomes approximately 50Ω on the basis of the above-described calculation equation. In this manner, as a result of adopting a microstrip configuration, the characteristic impedance can easily be adjusted, and a high-quality transmission line can be formed. For example, by using polyimide of a relative dielectric constant of ∈r=3.4 as the insulating substrate 31 of the flexible substrate 20 and by setting each parameter of the transmission line as B=0.09 mm, C=0.012 mm, and H=0.05 mm, the characteristic impedance can be set at approximately 50Ω.

Furthermore, as shown in FIG. 2, for the signal lines 32 and 34 of the flexible substrate 20, conduction is achieved by soldering at the pad on the reverse surface, and the signal lines 32 and 34 are connected to the obverse surface via the through hole provided in the pad. As a result, it becomes possible to cause the grounding film 36 on the reverse side to have an electromagnetic shielding effect so as to prevent electromagnetic radiation from the signal lines 32 and 34 from leaking outside the optical communication device 100. Also, it becomes possible to avoid an adverse influence on the signal lines 32 and 34 by external electromagnetic noise. In particular, in this exemplary embodiment, since the major portion of the first substrate 10 is covered by such a flexible substrate 20, the electromagnetic shielding characteristics can be increased further. Furthermore, since the circumference of each of the VCSEL 12 and the photodetector 14 can be surrounded by a grounding film, it becomes possible to suppress the influence of external noise even more. Furthermore, in the flexible substrate 20 of this exemplary embodiment, since the microstrip configuration is adopted in the manner described above, the electromagnetic radiation is small when compared to the case in which a metal terminal exposed to the air as in the can package is used, and the need to provide a shielding cover to prevent crosstalk between the transmission and reception in the signal lines 32 and 34 is small. In particular, in a case where the deterioration of signal quality is permitted by a certain degree as in the case of short-distance communication, the shielding cover can be omitted. Therefore, in this exemplary embodiment, the shielding cover is omitted.

Next, the arrangement of electro optical elements (the VCSEL 12 and the photodetector 14) and the flexible substrate 20 is described in detail.

Figure 3:
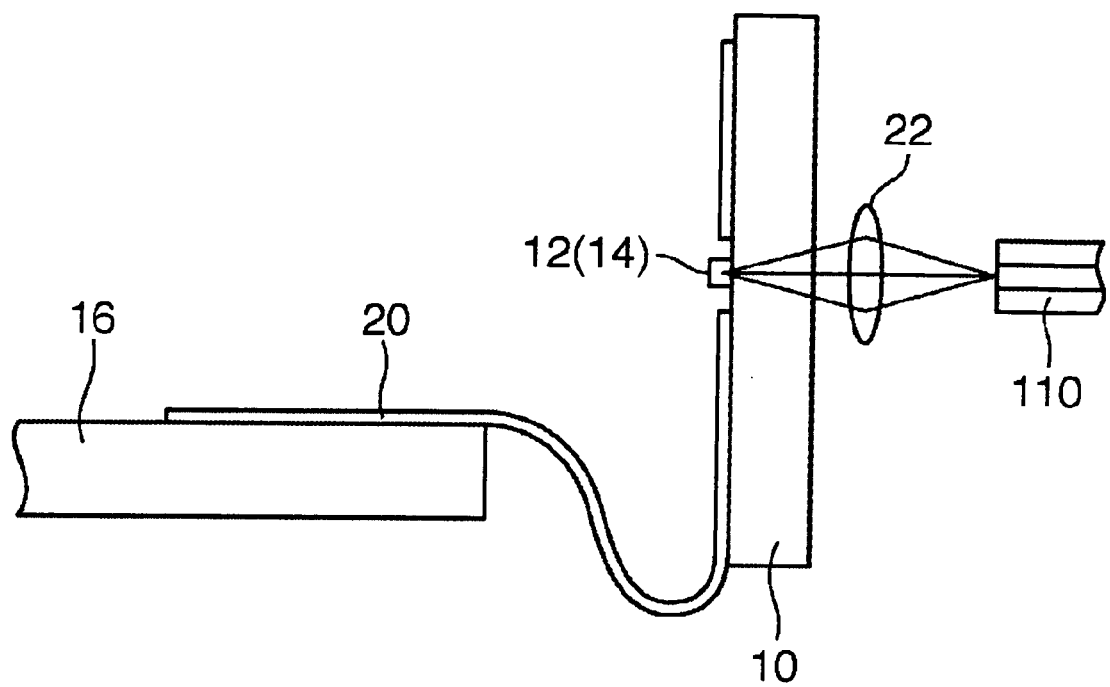
FIG. 3 illustrates the arrangement of each electro optical element and a flexible substrate.

FIG. 3 illustrates the arrangement of each electro optical element and the flexible substrate 20, and shows in detail the first substrate 10 and the periphery thereof in FIG. 1(B) in an enlarged manner.

As described above, the first substrate 10 is formed of a light-transmitting member, such as glass. As shown in FIG. 3, the light-emitting surface of the VCSEL 12 is arranged so as to face one side of the first substrate 10, and the outgoing light from the VCSEL 12 is emitted through the first substrate 10. Similarly, the light-receiving surface of the photodetector 14 is arranged so as to face one side of the first substrate 10, and the incident light to the photodetector 14 enters through the first substrate 10. As a result, the first substrate 10 also serves the function of protecting the light-emitting surface of the VCSEL 12 and the light-receiving surface of the photodetector 14, thus simplifying the device configuration.

In this exemplary embodiment, each of the VCSEL 12 and the photodetector 14, and the preamplifier 15 (see FIG. 2) is mounted with respect to the wiring pattern formed on the first substrate 10 by the flip-chip bonding method. Then, between each of the VCSEL 12 and the photodetector 14, and the first substrate 10, a bonding material (e.g., a transparent ultraviolet-ray cured resin) whose refractive index is made to match the material (e.g., glass) of the first substrate 10 is injected and cured. This reduces or prevents an influence of return light noise due to the reflection on the interface of the first substrate 10. Furthermore, by sealing the VCSEL 12 by using a sealing material (potting material) (not shown), environmental resistance is enhanced. Furthermore, as shown in FIG. 3, on the other side of the first substrate 10, the lens 22 is provided to couple (optical coupling) between each of the electro optical elements and the optical fiber 110. As described above, the lens 22 is incorporated in the sleeve 24. The sleeve 24 and the first substrate 10 are bonded and fixed after alignment adjustment, and furthermore, the sleeve 24 is bonded and fixed to the housing 26. The alignment of the sleeve 24, and the VCSEL 12 or the photodetector 14 is adjusted by a method using an alignment mark (a commonly called passive alignment method) or a method while driving the VCSEL 12 or the photodetector 14 (a commonly called active alignment method).

In the manner described above, in the optical communication device 100 of this exemplary embodiment, since the section between each of the VCSEL 12 and the photodetector 14, and the electronic circuit is connected by using the flexible substrate 20 in which the characteristic impedance can easily be adjusted so as to be suitable for the transmission of a high-frequency signal, it is possible to avoid signal deterioration by achieving impedance matching of the electrical signal in the entire transmission line. Therefore, it becomes possible to realize an optical communication device suitable for the transmission of a high-frequency signal. Furthermore, although the can package which has been used in the related art generally requires many mounting steps and is comparatively expensive, the optical communication device 100 of this exemplary embodiment is configured so as to not use the can package. Thus, there is the advantage that the cost of the optical communication device can be reduced.

The present invention is not limited to the contents of the above-described exemplary embodiments, and various modifications are possible within the spirit and scope of the present invention. For example, in addition to the above-described example shown in FIG. 3, each electro optical element (the VCSEL and the photodetector), the flexible substrate, and the lens can be arranged in various ways.

Figure 4:
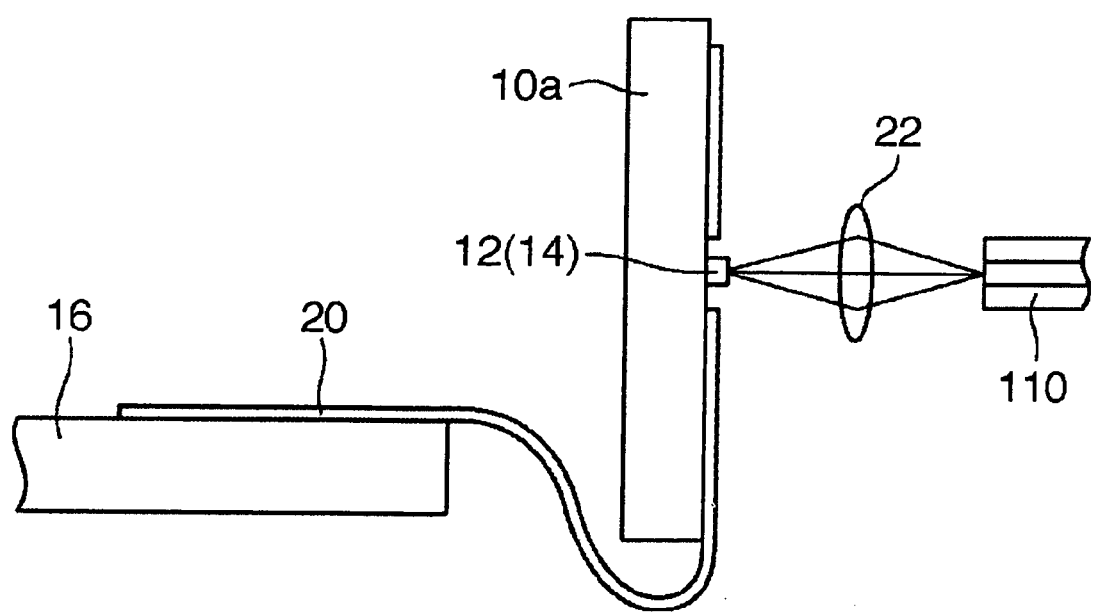
FIG. 4 illustrates another exemplary embodiment of the arrangement of each electro optical element, a flexible substrate, and a lens.
Figure 5:
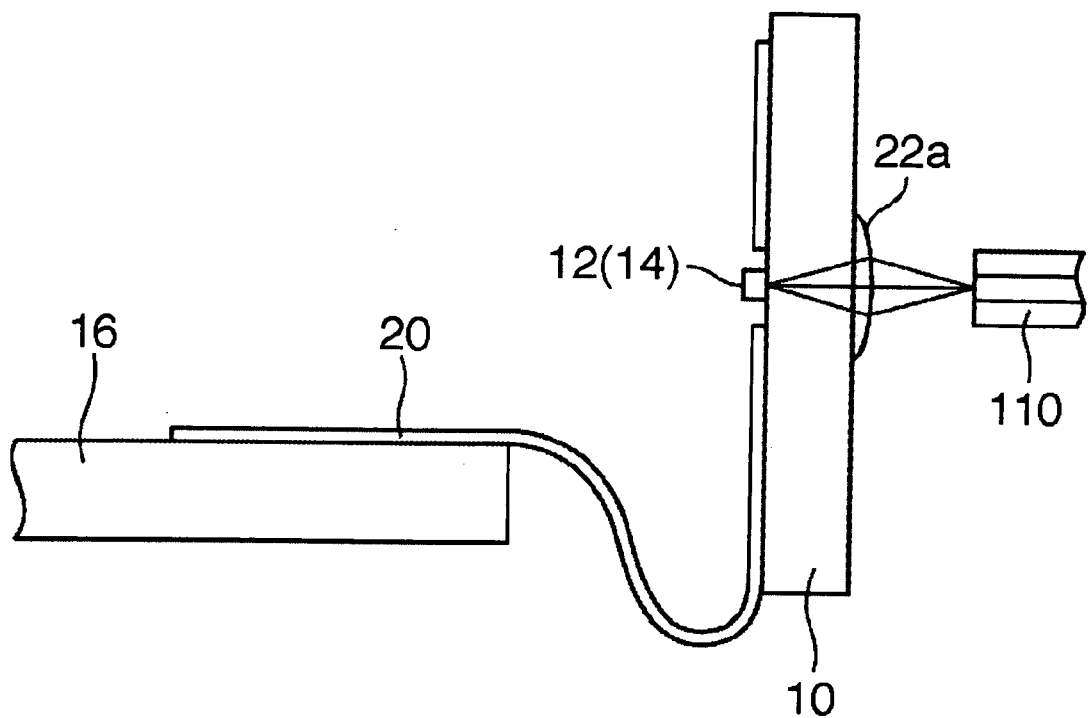
FIG. 5 illustrates another exemplary embodiment of the arrangement of each electro optical element, a flexible substrate, and a lens.
Figure 6:
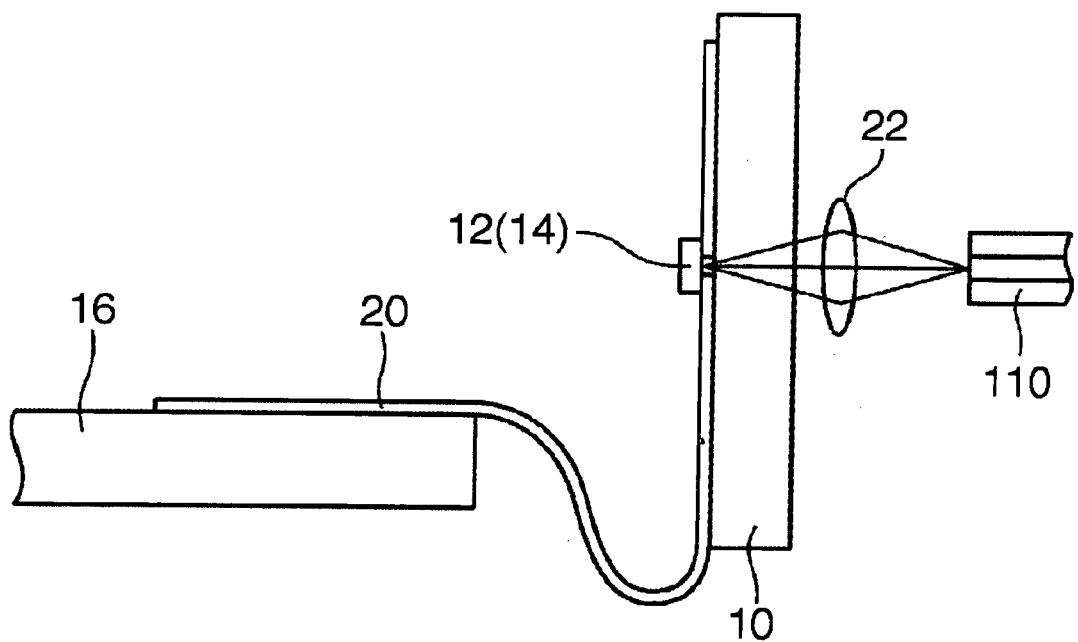
FIG. 6 illustrates another exemplary embodiment of the arrangement of each electro optical element, a flexible substrate, and a lens.

FIGS. 4 to 6 illustrate additional examples of the arrangement of each electro optical element, the flexible substrate, and the lens.

In the example shown in FIG. 4, in place of the light-transmitting first substrate 10 in the above-described exemplary embodiment, a first substrate 10a formed of a non-light-transmitting substrate, such as a glass epoxy substrate, is used. The VCSEL 12 and the photodetector 14 are arranged back-to-back with the side of the first substrate 10a on the optical fiber 110 side, and the flexible substrate 20 is also bonded to the same side. The light-emitting surface and the light-receiving surface of the VCSEL 12 and the photodetector 14 are directed toward the optical fiber 110 side (that is, free space). In a case where such an arrangement is to be adopted, since a substrate, such as an inexpensive glass epoxy substrate having a superior mechanical strength, which is suitable to form a wiring pattern and to mount elements, can be used, it is possible to realize an inexpensive optical communication device having superior electrical characteristics and superior mechanical characteristics.

In the example shown in FIG. 5, in place of the lens 22 in the above-described exemplary embodiment, a lens (microlens) 22a that is directly formed on the other surface of the first substrate 10 is used. Such a lens 22a can be formed on a side facing the surface of the first substrate 10 on which the electro optical elements are mounted by using a molding method, such as a 2P (Photo-Polymer) method. As a result of using a 2P method, etc., a plurality of lenses 22a are formed collectively with high positional accuracy on a large substrate, which is a base body for the first substrate 10, and thereafter, the base body is cut out, thereby making it possible to form a large number of first substrates 10 at a time. Thus, it becomes possible to realize a low-cost, highly accurate, compact optical communication device.

In the example shown in FIG. 6, the VCSEL 12, the photodetector 14, etc., are arranged on the flexible substrate 20 which is made to overlap the first substrate 10. The flexible substrate has an opening at which the light-emitting surface of VCSEL 12 and the light-receiving surface of the photodetector 14 is exposed. Signal light is transmitted and received through the opening formed in the flexible substrate 20. In a case where such an arrangement is to be adopted, since there is no need to form a wiring pattern on the first substrate 10, the manufacturing process can be simplified to achieve a lower cost. In particular, in a case where the first substrate 10 is formed from glass, since the wiring pattern need not be formed on a glass surface, which is comparatively difficult, the manufacturing process can be made easier, which is convenient. Furthermore, since the flexible substrate 20 is directly connected to the VCSEL 12, etc., the number of connection portions can be decreased, making it possible to transmit a wider bandwidth signal. Also, in the example shown in FIG. 6, similarly to the above-described example shown in FIG. 5, the lens may be directly formed on the first substrate 10.

In the manner described above, since each of the exemplary embodiments shown in FIGS. 4 to 6 has features that the arrangement of FIG. 4 is inexpensive, the arrangement of FIG. 5 is inexpensive, highly accurate and small sized, and the arrangement of FIG. 6 is inexpensive and has a wider bandwidth, an optical communication device can be formed by appropriately selecting one of these mounting arrangements according to various conveniences, such as the characteristics and the price, required for the optical communication device.

By further devising the structure of the flexible substrate, it becomes possible to reliably suppress crosstalk between individual transmission lines for transmission and reception.

Figure 7A:
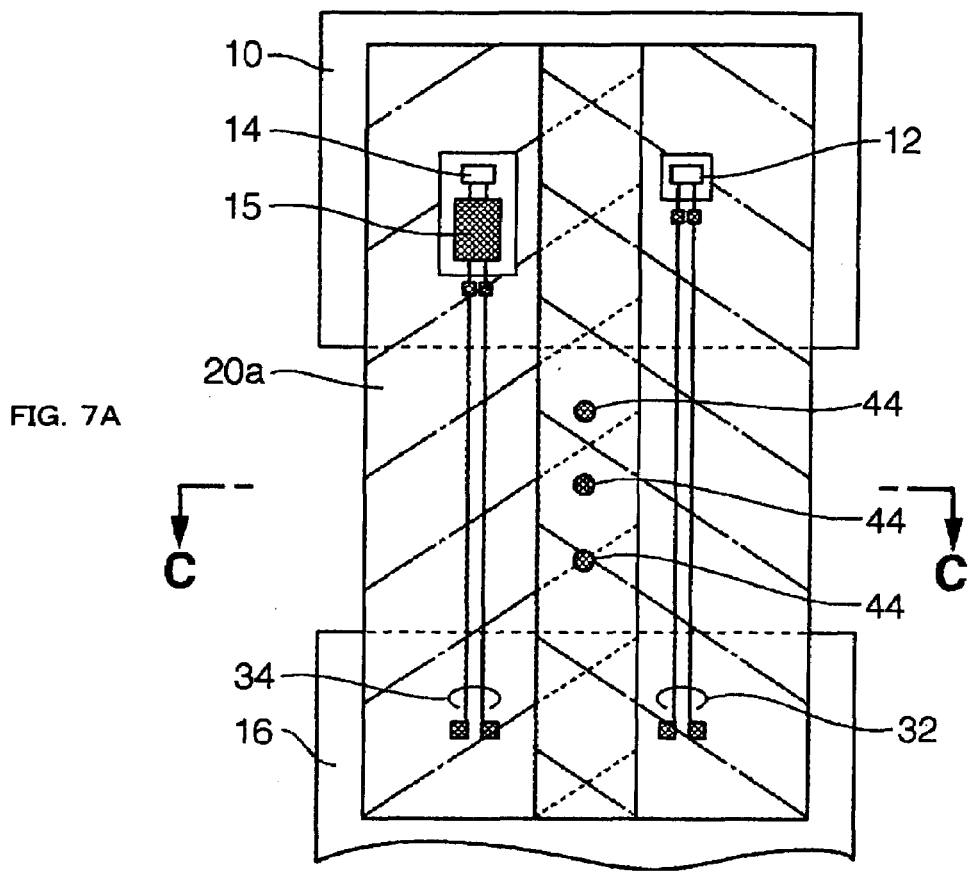
FIGS. 7(A) and 7(B) illustrate another exemplary embodiment of the flexible substrate.
Figure 7B:
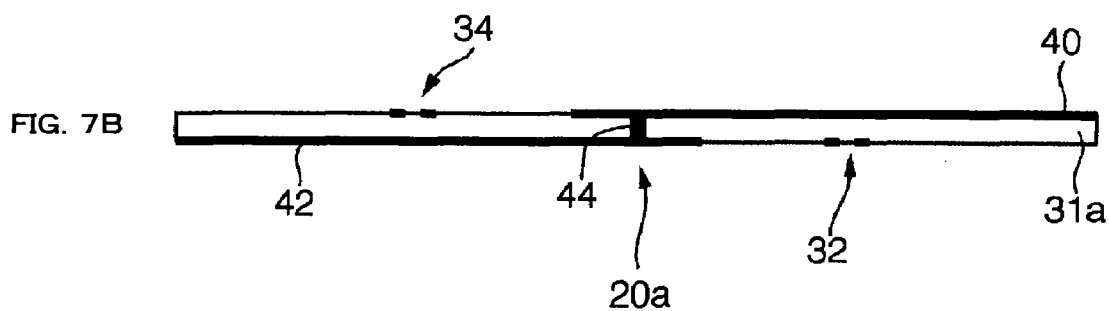

FIGS. 7(A) and (B) illustrate another example of the structure of the flexible substrate. FIG. 7A shows a plan view of a flexible substrate of this example, and FIG. 7(B) shows an enlarged, sectional view taken along the plane C—C shown in FIG. 7(A). A flexible substrate 20a shown in FIGS. 7(A) and 7(B) includes a first microstrip line formed of a signal line 32 and a grounding film 40, and a second microstrip line formed of a signal line 34 and a grounding film 42. For the first microstrip line, the signal line 32 is arranged on one side of an insulating substrate 31a, and for the second microstrip line, the signal line 34 is arranged on the other side of the insulating substrate 31a. The grounding film 40 and the grounding film 42 are arranged in such a manner as to partially overlap each other, with the insulating substrate 31a therebetween, in the central portion of the flexible substrate 20a, and are electrically connected to each other via a through hole 44 in the overlapping portion.

In this manner, as a result of arranging the signal line 32 on the transmission side and the signal line 34 on the receiving side separately on the obverse surface and the reverse surface, respectively, and as a result of arranging the grounding potential between them, it becomes possible to inexpensively realize an optical communication device having extremely good crosstalk characteristics between the transmission and reception. Even when the configuration shown in FIG. 7 is to be adopted, since the flexible substrate can be manufactured comparatively at a low cost, there is the advantage that an optical communication device having superior crosstalk characteristics can be realized at a low cost. When the flexible substrate 20a of this example is to be used, some electromagnetic radiation may be generated from the signal line 32 arranged outside (the optical fiber 110 side). In that case, the housing 26 may be formed by metal having an electromagnetic shielding effect.

In the above-described exemplary embodiments, the value of the characteristic impedance of the flexible substrate is set at 50Ω. Alternatively, another characteristic impedance value (e.g., 75Ω) may be used. Also, in this case, for the flexible substrate, the dimensions of the signal lines may be set so that desired characteristic impedance is obtained on the basis of the above-described calculation equation.

In the above-described exemplary embodiments, an optical communication device including both the configuration related to transmission (the VCSEL 12, etc.) and the configuration related to reception (the photodetector 14, etc.) has been described.

Alternatively, the present invention can similarly be applied to devices including only the configuration related to transmission (commonly called optical transmission modules) or devices including only the configuration related to reception (commonly called optical receiving modules).

What is claimed is:

1. An optical communication device, comprising:
  a first substrate having a light-emitting element or a light-receiving element on one side of the first substrate;
  a second substrate having an electronic circuit to perform operation control of the light-emitting element or the light-receiving element; and
  a flexible substrate which connects a section between the light-emitting element or the light-receiving element and the electronic circuit while achieving impedance matching, the flexible substrate including a microstrip line having a flexible insulating substrate, a signal line arranged on one side of the insulating substrate, and a grounding film arranged on the other side of the insulating substrate, and the microstrip line serves the impedance matching function, the flexible substrate including a first microstrip line including a flexible insulating substrate, a first signal line arranged on one side of the insulating substrate, and a first grounding film arranged on the other side of the insulating substrate and a second microstrip line including the insulating substrate, a second signal line arranged on the other side of the insulating substrate, and a second grounding film arranged on the one side of the insulating substrate.

2. The optical communication device according to claim 1,
  the first substrate having the light-emitting element, the light receiving element and a preamplifier,
  the preamplifier being mounted in proximity with the light receiving element and converts an output current of the light receiving element to a voltage signal.

3. The optical communication device according to claim 1, the first and second substrates being arranged in such a manner as to be nearly at right angles to each other.

4. The optical communication device according to claim 1, one end portion of the flexible substrate being bonded in such a manner as to cover nearly the entire surface of the first substrate.

5. The optical communication device according to claim 1,
the grounding film surrounding the light-emitting element or the light-receiving element.

6. The optical communication device according to claim 1, the first grounding film and the second grounding film being arranged in such a manner as to partially overlap each other, with the insulating substrate therebetween.

7. The optical communication device according to claim 1, the first substrate being formed of a light-transmitting member, and
a light-emitting surface or a light-receiving surface of the light-emitting element or the light-receiving element being arranged so as to face the first substrate.

8. The optical communication device according to claim 7, the light-emitting element or the light-receiving element being arranged inside an opening of the flexible substrate, which is made to overlap the first substrate.

9. The optical communication device according to claim 1, the light-emitting element or the light-receiving element being arranged on the flexible substrate, which is made to overlap the first substrate.

10. The optical communication device according to claim 9,
the flexible substrate having an opening that exposes a light-emitting surface of the light-emitting element or a light-receiving surface of the light-receiving element.

11. The optical communication device according to claim 8, further comprising:
a lens to collect outgoing light from the light-emitting element or incident light to the light-receiving element.

12. The optical communication device according to claim 11, the lens being formed integrally with the first substrate.

13. The optical communication device according to claim 1, the first substrate being formed of a non-light-transmitting member, and
the light-emitting element or the light-receiving element being arranged back-to-back with one side of the first substrate so that the light-emitting surface or the light-receiving surface is directed toward free space.

14. An optical communication device, comprising:

a first substrate having a light-emitting element or a light-receiving element on one side of the first substrate;

a second substrate having an electronic circuit to perform operation control of the light-emitting element or the light-receiving element; and a flexible substrate which connects a section between the light-emitting element or the light-receiving element and the electronic circuit while achieving impedance matching, the flexible substrate including a microstrip line having a flexible insulating substrate, a signal line on a transmission side arranged on only one side of the insulating substrate, a signal line on a receiving side arranged on only the other side of the insulating substrate, and the microstrip line serves the impedance matching function, the microstrip line further has a first grounding film arranged on the one side of the insulating substrate, a second grounding film arranged on the other side of the insulating substrate, and a through hole connected to the first grounding film and the second grounding film, and the through hole is arranged only between the signal line on the transmission side and the signal line on the receiving side.

* * * * *